United States Patent
Brigham et al.

(10) Patent No.: US 6,812,193 B2
(45) Date of Patent: Nov. 2, 2004

(54) SLURRY FOR MECHANICAL POLISHING (CMP) OF METALS AND USE THEREOF

(75) Inventors: Michael Todd Brigham, Charlotte, VT (US); Donald Francis Canaperi, Bridgewater, CT (US); Michael Addison Cobb, Croton-on-Hudson, NY (US); William Cote, Poughkeepsie, NY (US); Kenneth Morgan Davis, Newburgh, NY (US); Scott Alan Estes, Essex Junction, VT (US); Edward Jack Gordon, Bristol, VT (US); James Willard Hannah, Ossining, NY (US); Mahadevaiyer Krishnan, Hopewell Junction, NY (US); Michael Francis Lofaro, Milton, NY (US); Michael Joseph MacDonald, Yorktown Heights, NY (US); Dean Allen Schaffer, Essex Junction, VT (US); George James Slusser, Milton, VT (US); James Anthony Tornello, Cortlandt Manor, NY (US); Eric Jeffrey White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/231,047

(22) Filed: Aug. 30, 2002

(65) Prior Publication Data

US 2003/0073593 A1 Apr. 17, 2003

Related U.S. Application Data

(60) Provisional application No. 60/316,332, filed on Aug. 31, 2001.

(51) Int. Cl.$^7$ .................. C09K 13/00; H01L 21/00
(52) U.S. Cl. ............... 510/175; 510/176; 510/268; 433/692; 433/693; 252/79.1; 252/79.4
(58) Field of Search ............... 510/175, 176, 510/470; 438/692, 693; 252/79.1, 79.4, 79.2; 106/3; 51/308, 309; 451/41

(56) References Cited

U.S. PATENT DOCUMENTS

| | | | |
|---|---|---|---|
| 5,391,258 A | 2/1995 | Brancaleoni et al. | |
| 5,476,606 A | 12/1995 | Brancaleoni et al. | |
| 5,916,855 A | * 6/1999 | Avanzino et al. | 51/307 |
| 5,954,997 A | 9/1999 | Kaufman et al. | |
| 5,980,775 A | 11/1999 | Grumbine et al. | |
| 6,066,028 A | 5/2000 | Cheng et al. | |
| 6,068,787 A | 5/2000 | Grumbine et al. | |
| 6,083,840 A | 7/2000 | Mravic et al. | |
| 6,117,775 A | 9/2000 | Kondo et al. | |
| 6,126,853 A | 10/2000 | Kaufman et al. | |
| 6,140,239 A | 10/2000 | Avanzino et al. | |
| 6,171,352 B1 | 1/2001 | Lee et al. | |
| 6,217,416 B1 | 4/2001 | Kaufman et al. | |
| 6,251,150 B1 | 6/2001 | Small et al. | |
| 6,348,076 B1 | * 2/2002 | Canaperi et al. | 51/309 |
| 6,375,693 B1 | * 4/2002 | Cote et al. | 51/308 |

* cited by examiner

Primary Examiner—Gregory Webb
(74) Attorney, Agent, or Firm—Connolly Bove Lodge & Hutz, LLP; Robert M. Trepp

(57) ABSTRACT

Slurry compositions comprising an oxidizing agent, optionally a copper corrosion inhibitor, abrasive particles; surface active agent, a service of chloride and a source of sulfate ions.

29 Claims, 3 Drawing Sheets

SLURRY FOR MECHANICAL POLISHING (CMP) OF METALS AND USE THEREOF

CROSS-REFERENCE TO RELATED APPLICATIONS

This is a continuation-in-part of our copending U.S. application Ser. No. 60/316,332 filed Aug. 31, 2001, entitled "ADDITIVES TO ENHANCE POLISH RATES IN CMP SLURRIES", disclosure of which is incorporated herein by reference.

TECHNICAL FIELD

The present invention relates to slurry compositions that are useful for polishing or planarizing a surface. The present invention is especially useful for polishing or planarizing copper used as interconnect wiring in integrated circuit devices such as semiconductor wafers containing copper damascene and dual damascene features. The present invention also relates to polishing processes employing the compositions of the present invention.

BACKGROUND OF THE INVENTION

In the microelectronics industry, during the manufacture of an integrated circuit, surfaces that are typically scratch-free are polished for the purpose of planarizing the structure involved and/or removing unwanted material. The polishing involved is chemical mechanical polishing (CMP). For example, metals such as aluminum, copper, and tungsten are planarized. Moreover, there is typically a refractory metal liner beneath the aluminum, copper or tungsten providing good adhesion to the underlying insulator and good contact resistance to lower level moralizations. Typical liners include niobium, tantalum, tungsten and titanium alone or in combination with their nitrides, oxides and/or oxynitrides or any other refractory metal. Recently copper and alloys of copper have been developed as the chip interconnect/wiring material especially for VLSI and ULSI semiconductor chips.

The use of copper and copper alloys results in improved device performance when compared to aluminum and its alloys.

In fabricating the semiconductor devices, the metallic interconnect material of wiring structure such as copper or its alloys typically starts as a blanket electrodeposited film over a layer of dielectric which has trenched features etched into its surface. The deposited copper film fills the pre-etched gaps or trenches in the dielectric, and leaves a metal overabundance on the surface of the wafer which must be removed. Once the metal overabundance has been removed, an inlaid metal wiring structure is left on the surface of the wafer. This process is referred to as the damascene process. In general, the chemical mechanical polishing (CMP) involves a circular/orbital motion of a wafer under a controlled downward pressure with a polishing pad saturated with a conventional polishing slurry. In this manner, removal of the metal overabundance, and replanarization of the wafer surface is accomplished. More recently, polishing pads which are impregnated with suitable abrasive particles are being used for CMP processing. For a more detailed explanation of chemical mechanical polishing, please see U.S. Pat. Nos. 4,671,851, 4,910,155 and 4,944,836, the disclosures of which are incorporated herein by reference.

Polishing slurries used for CMP of metals are typically aqueous suspensions comprised of a metal oxide abrasive such as alumina or silica, organic acids, surfactants, chelates, and a suitable oxidizing agent. The role of the abrasive is to facilitate material removal by mechanical action. The oxidizing agent works to enhance mechanical removal via a dissolution process. Such oxidizing agents employed in commercially-available or proprietary slurries are typically inorganic metal salts such as $Fe(NO_3)_3$, or $KIO_3$, ammonium persulfate as well as hydrogen peroxide, present in significant concentrations. Complexing or chelating agents are present to prevent free copper ion buildup in the process slurry, which can lead to pad discoloration and increased oxidizer reactivity. These additives generally improve the polish performance of the CMP slurry.

One concern with current CMP slurries for Cu is that they typically provide polish rates of 200 to 500 angstroms/minutes. For example see U.S. Pat. Nos. 5,954,997, 6,117,775 and 6,126,853. Increasing the mechanical parameters such as downforce such as up to about 6 psi can provide polish rates of 1500–1700 angstroms/minutes. However, even at these rates, relatively long polish times are required to remove 1 to 2 microns of Cu in Back End Of the Line (BEOL) applications. Employing increased downforce is not desirable when polishing is to be performed on patterned wafers since this tends to result in increased dishing of Cu.

It would therefore be desirable to provide a process for polishing of Cu which overcomes the dishing and erosion problems. Moreover, the polishing process should also avoid scratching the copper surface, which is susceptible to scratching because it is relatively soft. Furthermore, the polishing slurry should provide high selectively towards Cu versus any liner material in contact with the Cu.

Further, by way of background, a description of selective polishing and CMP can be found in U.S. Pat. No. 5,676,587 to Landers at al. entitled "Selective Polish Process for Titanium, Titanium Nitride, Tantalum Nitride" which is incorporated herein by reference.

SUMMARY OF THE INVENTION

The present invention provides slurry compositions having significantly increased polish rates such as at least about 8000–9000 angstroms/minute without the need for a relatively high downforce of 6 psi or more. Accordingly, the present invention provides a significant reduction in polish times. The invention provides a slurry that can operate with low down force resulting in minimization of Cu recess and oxide erosion during CMP.

Moreover, the present invention provides a slurry that provides high selectivity towards Cu versus one of Ta, TaN, Ti, TiN, W, combinations thereof, and other liner materials by a judicious selection of the components of the composition. In particular, the present invention relates to a slurry composition comprising abrasive particles; an oxidizing and chloride ion source and a sulfate ion source.

The present invention also relates to polishing a surface which comprises providing and the surface to be polished the above disclosed slurry; and polishing the surface by contacting it with a polishing pad.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrative in nature and not restrictive.

BEST AND VARIOUS MODES FOR CARRYING OUT INVENTION

Figure 1:
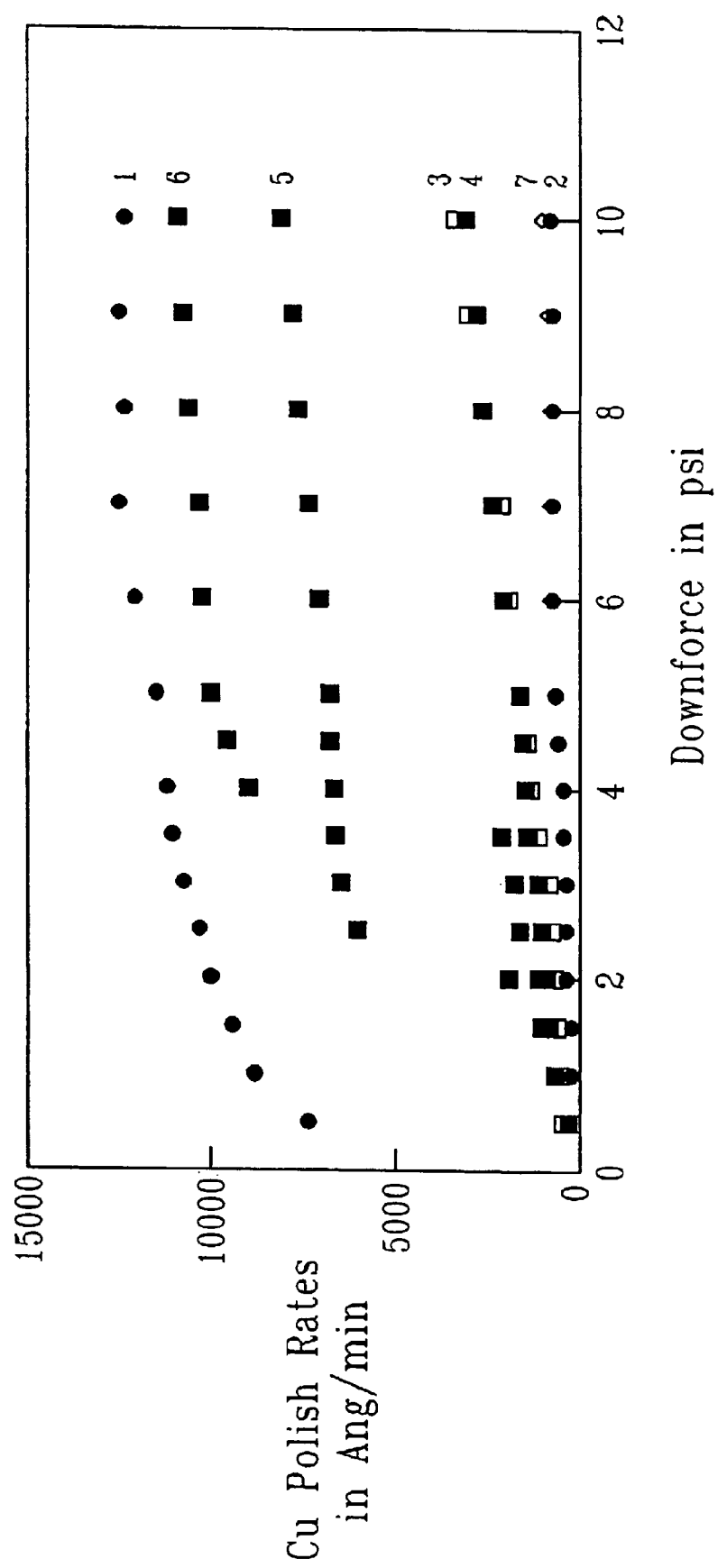
FIG. 1 shows the variation of copper polish rates as a function of downforce for various compositions.

The slurry compositions of the present invention comprise an oxidizing agent. Suitable oxidizing agents include oxidizing metal salts, oxidizing metal complexes, oxidizing acids such as nitric, persulfuric, peracetic and periodic acids, iron salts such as nitrates and sulfates; potassium ferricyanide, hydrogen peroxide, aluminum salts, sodium salts, potassium such as potassium iodate, ammonium salts such as ammonium cerium nitrate, phosphonium salts, chlorates, perchlorates such as potassium percholate, nitrates, permaganates such as potassium permanganate, persulfates and mixtures thereof.

The preferred oxidizing agents are ferric nitrate and hydrogen peroxide. The oxidizing agent(s) are typically present in the composition in amounts of about 1 to about 50 grams/liter, and preferably about 10 to about 40 grams/liter.

The compositions of the present invention, when employed to polish copper, also include a copper corrosion inhibitor. When the compositions are used for polishing Al or W, they can and preferably also include a copper corrosion inhibitor. Typical copper corrosion inhibitors include imidozoles, triazoles such as 1,2,4-triazole and benzotriazole. The amount of the copper corrosion inhibitor, when present, is typically about 0.1 to about 5 grams/liter, a typical example being about 2.5 grams/liter.

The compositions of the present invention also include abrasive particles. The abrasive particles employed include those conventionally used in polishing slurries. Examples of suitable abrasive particles include alumina, silica, ferric oxide, zirconia, ceria, and titanium dioxide and mixtures thereof. The preferred abrasive is alumina. Also, the abrasive particles can include a dual-valent rare earth ion or suspension of its colloidal hydroxide, wherein the rare earth ion is in its higher valent form. Examples of some suitable rare earths are $Ce^{4+}$, $Pr^{4+}$ and $Tb^{4+}$ or suspensions of their colloidal oxides, such as cerium oxide. The dual-valent rare earth or rare earth oxide colloid acts as an oxidation catalyst.

Dual-valent rare earth additives, such as those disclosed in the co-pending U.S. patent application Ser. No. 08/756, 361, the entire disclosure of which is hereby incorporated by reference, may be part of the polishing slurry.

The abrasive particles typically have a particle size of about 10 to about 1000 nanometers and preferably about 50 to about 200 nanometers. The amount of abrasive particles is typically about 0.5% to about 6% by weight, and preferably about 2% to about 4% by weight.

Mixtures of abrasives can be employed when desired. Examples of such mixtures include alumina (about 0.1 to about 6% by weight), silica (about 0.1 to about 5% by weight) and zirconia (about 0.1 to about 6% by weight). More typical mixtures of abrasive comprise alumina (about 1 to about 5% by weight) and silica (about 1 to about 20% by weight).

Also, the slurry of the present invention is preferably an aqueous slurry. Other types of suitable slurries include those using the diluent organic solvents such as propylene carbonate and mono and polyhydric alcohols such as methanol, ethanol, ethylene glycol and glycerol. Of course, mixtures of these diluents as well as mixtures with water can be used when desired.

The compositions of the present invention also contain a surface active agent. Suitable surface active agents include anionic, cationic, nonionic and zwitterionic compounds. Examples of some surfactants for use in the present invention are disclosed in, for example, Kirk-Othmer, *Encyclopedia of Chemical Terminology*, 3rd Edition, Vol. 22 (John Wiley & Sons, 1983), Sislet & Wood, *Encyclopedia of Surface Active Agents* (Chemical Publishing Co., Inc. 1964), McCutcheon's *Emulsifiers & Detergents, North American and International Edition* (McCutcheon Division, The MC Publishing Co., 1991), Ash, *The Condensed Encyclopedia of Surfactants* (chemical Publishing Co., Inc., 1989), Ash, *What Every Chemical Technologist Wants to Know About . . . Emulsifiers and Wetting Agents*, Vol. 1 (Chemical Publishing Co., Inc., 1988), Tadros, *Surfactants* (Academic Press, 1984), Napper, *Polymeric Stabilization of Colloidal Dispersion* (Academic Press, 1983) and Rosen, *Surfactants & Interfacial Phenomena*, $2^{nd}$ Edition (John Wiley & sons, 1989), all of which are incorporated herein by reference. Typical examples of suitable surface active agents are: Na-alkyl sulfates, Na-alkyl sulfonates, quarternary such as tetramethyl ammonium halides, Cetyl trimethy ammonium halides, hydroxides, nonyl ethers and combinations thereof. Preferred surface active agents are sulfates such as Na -hexyl, -heptyl, -octyl, nonyl and -lauryl sulfates with Na octyl sulfate being most preferred. Na octyl sulfate is commercially available under its trade designation of Dupanol 80 (Witco)), Standapol LF(Henkel/Cognis), Texapon 842, (Henkel), Texapon 890 (Henkel) Sulfotex OA (Henkel) and Polystep B-29 (Stephan).

The amount of surface active agent is typically about 0.1 to about 100 ml/l and preferably about 20 to about 50 ml/l.

The composition of the present invention also includes both a chloride ion source and a sulfate ion source. The chloride ion and sulfate ion sources are typically present as salts including salts of alkali metals such as sodium and potassium; alkaline earth metals such as calcium; and ammonia.

Preferred chloride ion source is sodium chloride, and preferred sulfate ion source is sodium sulfate.

The amount of each of the chloride ion source and sulfate ion source is typically about 0.001 to about 5 grams/liter with the preferred amounts for the chloride ion source being about 0.05 to about 0.1 grams/liter. The preferred amounts for the sulfate ion source is about 1 to about 3 grams/liter.

Preferably, but not necessarily, the slurry combination comprises two parts wherein Part A comprises the oxidizing agent, surface active agent, chloride ion source and sulfate ion source, and corrosion inhibitor, if present; and Part B comprises the abrasive particles.

The compositions of the present invention and especially the preferred concentrations of the components result in high polish rates of Cu at low downforce, good selectivity of Cu with respect to other liner materials such as Ta and Ti, cleaner surface after rinsing, better final topography and lower metallurgical defects such as scratching, pitting and the like.

The slurry compositions of the present invention is useful for polishing Cu, W, and Al and their alloys and is selective to Cu, W and Al with respect to Ti, TiN, Ta and TaN.

The structures treated pursuant to the present invention are typically semiconductor devices having copper interconnectors (lines, plugs, vias, global and local interconnects)

imbedded into a dielectric material such as silicon dioxide, which may also include a capping layer, such as silicon nitride as in low k dielectric/damascene and dual damascene structures. The silicon dioxide is typically a high density plasma deposited silicon dioxide or TEOS (tetraethylorthosilicate).

The copper interconnects typically use tantalum, tantalum nitride, titanium or titanium nitride or a combination thereof as a barrier or liner material between the copper and the dielectric. As such, the CMP composition contacts a variety of different materials, copper, the dielectric or capping layer, as well as the wafer backside, which is generally a thin layer of oxidized silicon.

Accordingly, the polishing composition must be also selective to remove the metal as contrasted to the dielectric.

The present invention makes it possible to achieve high polish rates of Cu at low downforce. For example, the downforce employed can be as low as 1 psi. Typically the downforce employed is about 1 psi, and preferably about 2 to about 6 psi. The other parameters of the polishing or planarizing can be determined by those skilled in the art once aware of this disclosure, without exercising undue experimentation. For instance, the rate of rotation of the polishing platen (pads) is typically about 10 to about 90 rpm, preferably about 40–80 rpm, and the speed of the rotation of the wafer carrier typically is about 10 to about 70 rpm and preferably about 15–60 rpm.

The polishing pads can be those conventionally used in polishing for microelectronics.

The polishing rates deliverable by the present invention are typically about 6,000 to about 11,000 Angstroms/minute and more typically about 8000 to about 9000 angstroms/minute.

The following non-limiting examples are presented to further illustrate the present invention.

In particular, Table 1 shows the polish rate of Cu in the presence and absence of various salts. In the absence of any added salt, Cu polish rate is low, about 330 Ang/min. However addition of 10 mM of NaCl increases the polish rate to about 9400 Ang/min. Additions of Duponol, an anionic surfactant based on Sodium Octyl sulfate also increases the Cu polish rate to about 1900 Ang/min. All other salts show no significant enhancement in Cu polish rate.

In the examples given below the slurry contains 10 g/l of ferric nitrate, 1.5 W % of alumina and 1.5 grams/liter of Benzotriazole. The Na Octyl sulfate is present as a commercially available surfactant Duponol (Dupont), Standapol (Cognis) or Texapon (Cognis)

TABLE 1

Cu Polish rates in Ang/min
DF 5 psi, RR Platen/Carrier
50/30 IC-1000 pad
Westech 372
Polisher
Ferric Nitrate, BTA, Alumina + salts

|   | Salts 10 (mM) | Cu polish rate Ang/min |
|---|---|---|
| 1 | Ferric Nitrate + BTA + Alumina | 330 |
| 2 | + NaCl | 9417 |
| 3 | + Na$_2$SO$_4$ | 268 |
| 4 | + Na Citrate 2H$_2$O | 312 |
| 5 | + NaNO$_3$ | 274 |

TABLE 1-continued

Cu Polish rates in Ang/min
DF 5 psi, RR Platen/Carrier
50/30 IC-1000 pad
Westech 372
Polisher
Ferric Nitrate, BTA, Alumina + salts

|   | Salts 10 (mM) | Cu polish rate Ang/min |
|---|---|---|
| 6 | + Na$_2$HPO$_4$ | 233 |
| 7 | + Na Oxalate | 281 |
| 8 | + Na$_2$SiF$_6$ | 224 |
| 9 | + NaF | 260 |
| 10 | + Dupono (Na Octyl Sulfate) | 1936 |

Table 2 shows the polish rate of Cu when Duponol (Na Octyl Sulfate) and other Na salts are present. Clearly Sulfate and Chloride increase the Cu polish rates while the others have no significant effect.

TABLE 2

Cu Polish rates
DF 5 psi, RR Platen/Carrier 50/30 IC-1000 pad
Westech 372 polisher
Ferric Nitrate, BTA, Alumina, 10 mMNa Octyl sulfate + salts

|   | Salts 10 (mM) | Cu polish rate Ang/min |
|---|---|---|
| 1 | Ferric Nitrate + BTA + Alumina + Duponol (Na Octyl Sulfate) | 1936 |
| 2 | + NaCl | 5105 |
| 3 | + Na$_2$SO$_4$ | 3142 |
| 4 | + Na Citrate 2H$_2$O | 2365 |
| 5 | + NaNO$_3$ | 1960 |
| 6 | + Na$_2$HPO$_4$ | 1124 |
| 7 | + Na Oxalate | 2569 |
| 8 | + Na$_2$SiF$_6$ | 2132 |
| 9 | + NaF | 1865 |

Table 3 shows the combined effect of Chloride and other salts. Addition of Chloride enhances the Cu polish rates under all conditions.

TABLE 3

Cu Polish rates in Ang/min
DF 5 psi, RR Platen/Carrier 50/30 IC-1000 pad
Westech 372 polisher
Ferric Nitrate, BTA, Alumina + 10 mMNaCl + salts

|   | Salts 10 (mM) | Cu polish rate Ang/min |
|---|---|---|
| 1 | Ferric Nitrate + BTA + Alumina + NaCl | 9417 |
| 2 | + Na$_2$SO$_4$ | 8862 |
| 3 | + Na Citrate 2H$_2$O | 8483 |
| 4 | + NaNO$_3$ | 9540 |
| 5 | + Na$_2$HPO$_4$ | 8393 |
| 6 | + Na Oxalate | 10061 |
| 7 | + Na$_2$SiF$_6$ | 6626 |
| 8 | + NaF | 8914 |
| 9 | Na Octyl Sulfate | 5105 |

Table 4 shows the combined effect of NaCl, Na Octylsulfate and other salts.

TABLE 4

Cu Polish rates in Ang/min
DF 5 psi, RR Platen/Carrier 50/30 IC-1000 pad
Westech 372 polisher
Ferric Nitrate, BTA,
Alumina + 10 mM Na Octyl Sulfate, 10 mM NaCl + salts

| | Salts 10 (mM) | Cu polish rate Ang/min |
|---|---|---|
| 1 | Ferric Nitrate + BTA + Alumina Na Octyl Sulfate + NaCl | 5105 |
| 2 | + $Na_2SO_4$ | 8337 |
| 3 | + Na Citrate $2H_2O$ | 4626 |
| 4 | + $NaNO_3$ | 7088 |
| 5 | + $Na_2HPO_4$ | 7886 |
| 6 | + Na Oxalate | 8325 |
| 7 | + $Na_2SiF_6$ | 7246 |
| 8 | + NaF | 8119 |

FIG. 1 shows the variation of Cu polish rates vs Downforce for the various additives. A comparison of curves 1 and 2 shows that the presence of BTA lowers the Cu polish rates even at higher downforce. Addition of Chloride, does not increase the polish rates significantly (curves 3,4, & 7). However a combination of Na octyl sulfate with significantly as indicated by cures 5 and 6.

Figure 2:
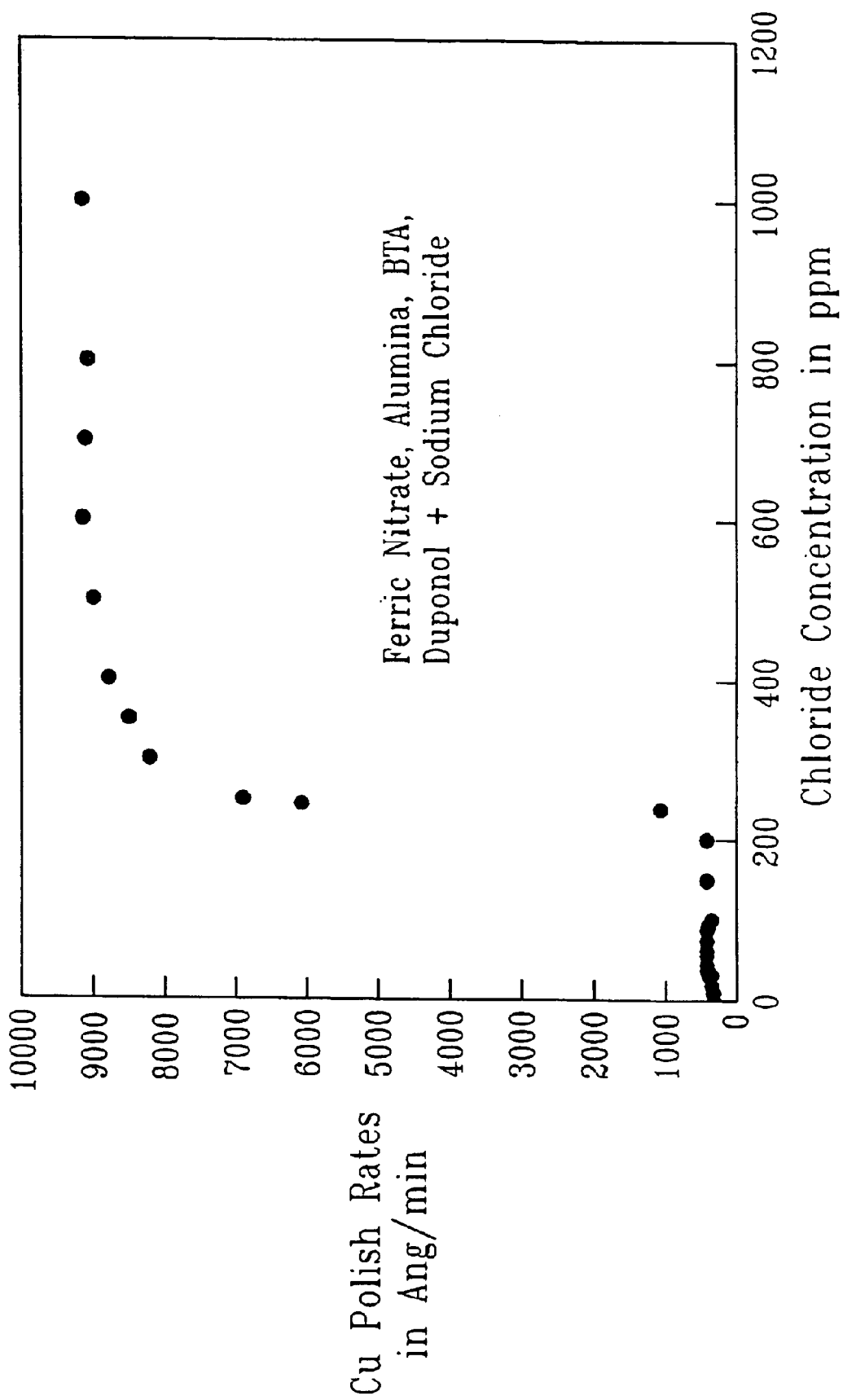
FIG. 2 and FIG. 3 shows the variation of copper polish rates as a function of concentration for different compositions.
Figure 3:
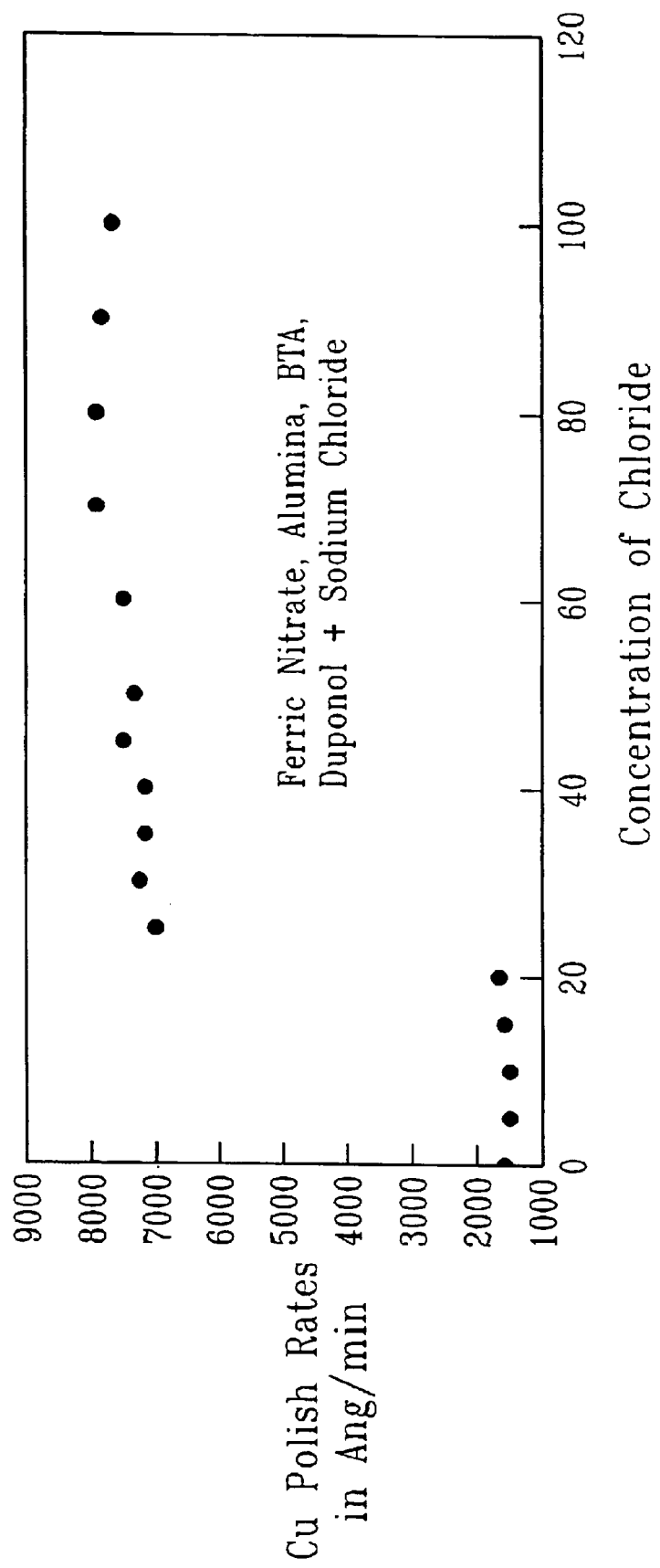

Comparison of FIGS. 2 and 3 show that in the presence of Na Octyl sulfate (Duponol) higher polish rates can be obtained even at lower concentrations of Chloride.

This invention provides a technique for polishing with two streams of slurry portions comprising part A in a first stream and part B in a second stream. In different embodiments of the invention various combinations of flow rates can use to create different compositions of the slurry that are best suited for the given application. Such flows can be regulated at different times during the polishing to create different compositions of the slurry at various states of polishing.

The foregoing description of the invention illustrates and describes the present invention. Additionally, the disclosure shows and describes only the preferred embodiments of the invention, but as mentioned above, it is to be understood that the invention is capable of use in various other combinations, modifications and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A slurry composition comprising about 0.5 to about 6% by weight of the abrasive particles, about 1 to 50 g/l of the oxidizer, about 0.1 to about 100 ml/l of the surface active agent; about 0.001 to about 5 g/l of the chloride ion source and about 0.001 to about 20 g/l of the sulfate ion.

2. The slurry composition of claim 1, which further contains a corrosion inhibitor.

3. The slurry composition of claim 2, wherein the amount of corrosion inhibitor is about 0.1 to about 5 grams/liter.

4. The slurry composition of claim 3 wherein the corrosion inhibitor is selected from the group consisting of imidozoles, triazoles and substituted triazoles.

5. The slurry composition of claim 3 wherein the corrosion inhibitor comprises benzotriazole.

6. The slurry composition of claim 1 wherein the chloride ion source comprises sodium chloride.

7. The slurry composition of claim 1 wherein the amount of chloride ion source is about 0.05 to about 0.1 grams/liter.

8. The slurry composition of claim 1 wherein the amount of sulfate ion source is about 1 to about 3 grams/litter.

9. The slurry composition of claim 1, wherein the amount of sulfate ion source comprises sodium sulfate.

10. The slurry composition of claim 1, wherein the oxidizing agent comprises ferric nitrate.

11. The slurry composition of claim 1, wherein the abrasive particles comprise alumina.

12. The slurry composition of claim 1, wherein the surface active agent comprises a sulfate.

13. The slurry composition of claim 12, wherein the sulfate is selected from the group consisting of sodium hexylsulfate, sodium heptyl sulfate, sodium octyl sulfate, sodium nonyl sulfate, and sodium lauryl sulfate, and mixtures thereof.

14. The slurry composition of claim 1, wherein the surface active agent is selected from the group consisting of sodium alkyl sulfate, alkyl sulfonates, quaternary ammonium salts, nonyl ethers, and mixtures thereof.

15. The slurry composition of claim 1, wherein the surface active agent comprises sodium octyl sulfate.

16. A method for polishing a surface comprising providing on the surface a slurry composition, according to claim 1, and polishing the surface by contacting it with a polishing pad.

17. The method of claim 16, wherein the surface is selected from the group consisting of copper, aluminum, tungsten, and their alloys.

18. The method of claim 17, wherein the surface to be polished is copper or a copper alloy, and wherein the slurry composition further comprises a copper corrosion inhibitor.

19. The method of claim 18, wherein beneath the copper or copper alloy is a refractory metal liner.

20. The method of claim 19, wherein the refractory metal liner is selected from the group consisting of niobium, tantalum, titanium, nitrides thereof, and mixtures thereof.

21. The method of claim 16, wherein the polishing is carried out employing a downforce of about 1 to about 9 psi.

22. The method of claim 21 wherein the downforce is about 2 to about 6 psi.

23. The method of claim 18, wherein the speed of the polishing pad during the polishing is about 10 to about 90 rpm, and the speed of the wafer carrier during the polishing is about 10 to about 70 rpm.

24. The slurry composition of claim 1 wherein the chloride ion source comprises a chloride salt of an alkali metal or an alkaline earth metal; the sulfate ion source comprises a sulfate salt of an alkali metal or an alkaline earth metal; the oxidizing agent comprises ferric nitrate; the abrasive particles comprise alumina; and the surface active agent comprise a sulfate.

25. The slurry composition of claim 24 wherein the chloride ion source comprises sodium chloride and the sulfate ion source comprises sodium sulfate.

26. The slurry composition of claim 25 wherein the surface active agent comprises a sulfate selected from the group consisting of sodium hexylsulfate, sodium heptyl sulfate, sodium octyl sulfate, sodium nonyl sulfate, and sodium lauryl sulfate, and mixtures thereof.

27. The slurry composition of claim 25, wherein the surface active agent is selected from the group consisting of sodium alkyl sulfate, alkyl sulfonates, quaternary ammonium salts, nonyl ethers, and mixtures thereof.

28. The slurry composition of claim 24 which further comprises a corrosion inhibitor selected from the group consisting of imidozoles, triazoles and substituted triazoles.

29. The slurry composition of claim 28 wherein the corrosion inhibitor comprises benzotriazole.

* * * * *